(12) United States Patent
Bhutta

(10) Patent No.: US 10,026,594 B2
(45) Date of Patent: *Jul. 17, 2018

(54) RF IMPEDANCE MATCHING NETWORK

(71) Applicant: Reno Technologies, Inc., Wilmington, DE (US)

(72) Inventor: Imran Ahmed Bhutta, Moorestown, NJ (US)

(73) Assignee: RENO TECHNOLOGIES, INC.

( * ) Notice: Subject to any disclaimer, the term of this patent is extended or adjusted under 35 U.S.C. 154(b) by 9 days.

This patent is subject to a terminal disclaimer.

(21) Appl. No.: 15/291,260

(22) Filed: Oct. 12, 2016

(65) Prior Publication Data

US 2017/0032938 A1   Feb. 2, 2017

Related U.S. Application Data

(63) Continuation of application No. 14/594,262, filed on Jan. 12, 2015, now Pat. No. 9,496,122.

(Continued)

(51) Int. Cl.
  *H01J 7/24* (2006.01)
  *H01J 37/32* (2006.01)
  (Continued)

(52) U.S. Cl.
  CPC .. *H01J 37/32183* (2013.01); *H01J 37/32091* (2013.01); *H01L 21/67069* (2013.01);
  (Continued)

(58) Field of Classification Search
  CPC ....... H05H 1/46; H05H 1/24; H01J 37/32082; H01J 37/32192; H01J 37/32174;
  (Continued)

(56) References Cited

U.S. PATENT DOCUMENTS

| | | |
|---|---|---|
| 4,110,700 A | 8/1978 | Rosen et al. |
| 4,679,007 A | 7/1987 | Reese et al. |

(Continued)

FOREIGN PATENT DOCUMENTS

| | | |
|---|---|---|
| EP | 0840349 | 5/1998 |
| EP | 0840350 | 5/1998 |
| WO | 2006096589 | 9/2006 |

*Primary Examiner* — Minh D A
(74) *Attorney, Agent, or Firm* — The Belles Group, P.C.

(57) ABSTRACT

In one embodiment, an RF impedance matching network includes an RF input configured to operably couple to an RF source; an RF output configured to operably couple to a plasma chamber; a first electronically variable capacitor having a first variable capacitance; a second electronically variable capacitor having a second variable capacitance; and a control circuit operably coupled to the first and second electronically variable capacitors. The control circuit is configured to determine the variable impedance of the plasma chamber, determine a first capacitance value for the first variable capacitance and a second capacitance value for the second variable capacitance, and generate a control signal to alter the first and/or second variable capacitance. An elapsed time between determining the variable impedance of the plasma chamber to when RF power reflected back to the RF source decreases is less than about 150 μsec.

25 Claims, 9 Drawing Sheets

Related U.S. Application Data

(60) Provisional application No. 61/925,974, filed on Jan. 10, 2014.

(51) Int. Cl.
  H01L 21/67 (2006.01)
  H03H 7/01 (2006.01)
  H03H 7/40 (2006.01)
  H01L 21/02 (2006.01)
  H01L 21/3065 (2006.01)
  H01L 21/311 (2006.01)
  H01L 21/3213 (2006.01)

(52) U.S. Cl.
  CPC ............ H03H 7/0138 (2013.01); H03H 7/40 (2013.01); *H01J 2237/327* (2013.01); *H01J 2237/332* (2013.01); *H01J 2237/334* (2013.01); *H01L 21/0262* (2013.01); *H01L 21/02274* (2013.01); *H01L 21/3065* (2013.01); *H01L 21/31116* (2013.01); *H01L 21/31138* (2013.01); *H01L 21/32136* (2013.01)

(58) Field of Classification Search
  CPC ............... H01J 37/32183; H01J 37/321; H01J 37/3211; H01J 37/32623; H03H 7/40; H03H 7/38; H03H 11/245; H01P 5/04; B82Y 10/00
  See application file for complete search history.

(56) References Cited

U.S. PATENT DOCUMENTS

| | | | |
|---|---|---|---|
| 4,692,643 | A | 9/1987 | Tokunaga et al. |
| 4,751,408 | A | 6/1988 | Rambert |
| 4,929,855 | A | 5/1990 | Ezzeddine |
| 5,012,123 | A | 4/1991 | Ayasli et al. |
| 5,079,507 | A | 1/1992 | Ishida et al. |
| 5,654,679 | A † | 8/1997 | Mavretic |
| 5,815,047 | A | 9/1998 | Sorensen et al. |
| 5,849,136 | A | 12/1998 | Mintz et al. |
| 5,880,921 | A | 3/1999 | Tham et al. |
| 5,889,252 | A | 3/1999 | Williams et al. |
| 5,971,591 | A | 10/1999 | Vona et al. |
| 6,046,641 | A | 4/2000 | Chawla et al. |
| 6,137,367 | A | 10/2000 | Ezzedine et al. |
| 6,252,354 | B1 | 6/2001 | Collins et al. |
| 6,400,012 | B1 | 6/2002 | Miller et al. |
| 6,424,232 | B1 | 7/2002 | Mavretic et al. |
| 6,583,572 | B2 | 6/2003 | Veltrop et al. |
| 6,621,372 | B2 | 9/2003 | Kondo et al. |
| 6,642,661 | B2 † | 11/2003 | Strang |
| 6,657,395 | B2 | 12/2003 | Windhorn |
| 6,677,828 | B1 | 1/2004 | Harnett et al. |
| 6,703,080 | B2 | 3/2004 | Reyzelman et al. |
| 6,791,274 | B1 | 9/2004 | Hauer et al. |
| 6,794,951 | B2 | 9/2004 | Finley |
| 6,818,562 | B2 | 11/2004 | Todorow et al. |
| 6,888,313 | B2 | 5/2005 | Blackburn et al. |
| 6,888,396 | B2 | 5/2005 | Hajimiri et al. |
| 6,946,847 | B2 | 9/2005 | Nishimori et al. |
| 6,967,547 | B2 | 11/2005 | Pellegrini et al. |
| 7,004,107 | B1 | 2/2006 | Raoux et al. |
| RE39,051 | E | 3/2006 | Harnett |
| 7,071,786 | B2 | 7/2006 | Inoue et al. |
| 7,095,178 | B2 | 8/2006 | Nakano et al. |
| 7,113,761 | B2 | 9/2006 | Bickham et al. |
| 7,122,965 | B2 | 10/2006 | Goodman |
| 7,164,236 | B2 | 1/2007 | Mitrovic et al. |
| 7,199,678 | B2 | 4/2007 | Matsuno |
| 7,251,121 | B2 | 7/2007 | Bhutta |
| 7,298,091 | B2 | 11/2007 | Pickard et al. |
| 7,298,128 | B2 | 11/2007 | Bhutta |
| 7,304,438 | B2 | 12/2007 | Kishinevsky |
| 7,332,981 | B2 | 2/2008 | Matsuno |
| 7,439,610 | B2 | 10/2008 | Weigand |
| 7,480,571 | B2 | 1/2009 | Howald et al. |
| 7,495,524 | B2 | 2/2009 | Omae et al. |
| 7,498,908 | B2 | 3/2009 | Gurov |
| 7,514,935 | B2 | 4/2009 | Pankratz |
| 7,518,466 | B2 | 4/2009 | Sorensen et al. |
| 7,535,312 | B2 | 5/2009 | McKinzie, III |
| 7,602,127 | B2 | 10/2009 | Coumou |
| 7,642,879 | B2 | 1/2010 | Matsuno |
| 7,666,464 | B2 | 2/2010 | Collins et al. |
| 7,714,676 | B2 | 5/2010 | McKinzie, III |
| 7,728,602 | B2 | 6/2010 | Valcore et al. |
| 7,745,955 | B2 | 6/2010 | Kirchmeier et al. |
| 7,755,300 | B2 | 7/2010 | Kishinevsky et al. |
| 7,764,140 | B2 | 7/2010 | Nagarkatti et al. |
| 7,777,567 | B2 | 8/2010 | Polizze |
| 7,852,170 | B2 | 12/2010 | McKinzie, III |
| 7,863,996 | B2 | 1/2011 | Cotter et al. |
| 7,868,556 | B2 | 1/2011 | Xia |
| 7,872,523 | B2 | 1/2011 | Sivakumar et al. |
| 7,917,104 | B2 | 3/2011 | Manssen et al. |
| 7,969,096 | B2 | 6/2011 | Chen |
| 8,008,982 | B2 | 8/2011 | McKinzie, III |
| 8,040,068 | B2 | 10/2011 | Coumou et al. |
| RE42,917 | E | 11/2011 | Hauer et al. |
| 8,089,026 | B2 | 1/2012 | Sellers |
| 8,102,954 | B2 | 1/2012 | Coumou |
| 8,110,991 | B2 | 2/2012 | Coumou |
| 8,203,859 | B2 | 6/2012 | Omae et al. |
| 8,217,731 | B2 | 7/2012 | Mckinzie, III |
| 8,217,732 | B2 | 7/2012 | McKinzie, III |
| 8,228,112 | B2 | 7/2012 | Reynolds |
| 8,237,501 | B2 | 8/2012 | Owen |
| 8,264,154 | B2 | 9/2012 | Banner et al. |
| 8,278,909 | B2 | 10/2012 | Fletcher |
| 8,289,029 | B2 | 10/2012 | Coumou |
| 8,299,867 | B2 | 10/2012 | McKinzie, III |
| 8,314,561 | B2 | 11/2012 | Fisk et al. |
| 8,330,432 | B2 | 12/2012 | Van Zyl et al. |
| 8,334,657 | B2 | 12/2012 | Xia |
| 8,334,700 | B2 | 12/2012 | Coumou et al. |
| 8,335,479 | B2 | 12/2012 | Koya et al. |
| 8,344,559 | B2 | 1/2013 | Van Zyl et al. |
| 8,344,801 | B2 | 1/2013 | Owen et al. |
| 8,368,308 | B2 | 2/2013 | Banna et al. |
| 8,368,469 | B2 | 2/2013 | Mohammadi et al. |
| 8,395,322 | B2 | 3/2013 | Coumou |
| 8,415,885 | B2 | 4/2013 | Yamazawa |
| 8,416,008 | B2 † | 4/2013 | Van Zyl |
| 8,436,643 | B2 † | 5/2013 | Mason |
| 8,461,842 | B2 | 6/2013 | Thuringer et al. |
| 8,466,736 | B1 | 6/2013 | Reynolds |
| 8,487,706 | B2 | 7/2013 | Li et al. |
| 8,502,689 | B2 | 8/2013 | Chen et al. |
| 8,513,889 | B2 * | 8/2013 | Zhang ............... H01J 37/32183 118/715 |
| 8,520,413 | B2 | 8/2013 | Tran et al. |
| 8,536,636 | B2 | 9/2013 | Englekirk |
| 8,552,665 | B2 | 10/2013 | Larson et al. |
| 8,558,633 | B2 | 10/2013 | Mckinzie, III |
| 8,559,907 | B2 | 10/2013 | Burgener et al. |
| 8,564,381 | B2 | 10/2013 | McKinzie |
| 8,569,842 | B2 | 10/2013 | Weis et al. |
| 8,576,010 | B2 | 11/2013 | Yanduru |
| 8,576,013 | B2 | 11/2013 | Coumou |
| 8,587,321 | B2 | 11/2013 | Chen et al. |
| 8,620,236 | B2 | 12/2013 | Manssen et al. |
| 8,624,501 | B2 | 1/2014 | Nagarkatti et al. |
| 8,633,782 | B2 | 1/2014 | Nagarkatti et al. |
| 8,638,159 | B2 | 1/2014 | Ranta et al. |
| 8,649,754 | B2 | 2/2014 | Burgener et al. |
| 8,659,335 | B2 | 2/2014 | Nagarkatti et al. |
| 8,674,606 | B2 | 3/2014 | Carter et al. |
| 8,680,928 | B2 | 3/2014 | Jeon et al. |
| 8,686,796 | B2 | 4/2014 | Presti |
| 8,710,926 | B2 | 4/2014 | Nagarkatti et al. |
| 8,716,984 | B2 | 5/2014 | Mueller et al. |
| 8,723,423 | B2 | 5/2014 | Hoffman et al. |
| 8,742,669 | B2 | 6/2014 | Carter et al. |

(56) References Cited

U.S. PATENT DOCUMENTS

| | | |
|---|---|---|
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlieek et al. |
| 8,884,180 B2 | 11/2014 | Ilic et al. |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 9,496,122 B1 * | 11/2016 | Bhutta ............ H01J 37/32091 |
| 2002/0060914 A1 | 5/2002 | Porter et al. |
| 2003/0001511 A1 | 1/2003 | Howald et al. |
| 2003/0007372 A1 | 1/2003 | Porter et al. |
| 2003/0046013 A1 | 3/2003 | Gerrish |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |

\* cited by examiner

† cited by third party

RF IMPEDANCE MATCHING NETWORK

CROSS REFERENCE TO RELATED APPLICATIONS

The present application is a continuation of U.S. application Ser. No. 14/594,262, filed Jan. 12, 2015, which claims the benefit of U.S. Provisional Application Ser. No. 61/925,974, filed Jan. 10, 2014. The disclosures of the aforementioned priority applications are incorporated herein by reference in their entirety.

FIELD OF THE INVENTION

The field of the present invention relates to RF matching networks, and particularly to RF matching networks that may be used with plasma chambers used in the fabrication of semiconductor devices.

BACKGROUND OF THE INVENTION

The semiconductor device fabrication process uses plasma processing at different stages to make semiconductor devices, which may include a microprocessor, a memory chip, and other types integrated circuits and devices. Plasma processing involves energizing a gas mixture by imparting energy to the gas molecules by introducing RF (radio frequency) energy into the gas mixture. This gas mixture is typically contained in a vacuum chamber, referred to as a plasma chamber, and the RF energy is typically introduced into the plasma chamber through electrodes.

In a typical plasma process, the RF generator generates power at a radio frequency—which is broadly understood as being within the range of 3 kHz and 300 GHz—and this power is transmitted through RF cables and networks to the plasma chamber. In order to provide efficient transfer of power from the RF generator to the plasma chamber, an intermediary circuit is used to match the fixed impedance of the RF generator with the variable impedance of the plasma chamber. Such an intermediary circuit is commonly referred to as an RF impedance matching network, or more simply as an RF matching network.

The purpose of the RF matching network is to transform the variable plasma impedance to a value that more closely matches the fixed impedance of the RF generator. In many cases, particularly in semiconductor fabrication processes, the system impedance of the RF generator is fixed at 50 Ohms, and RF power is transmitted through coaxial cables which also have a fixed impedance of 50 Ohms. Unlike the impedance of the RF generator and the coaxial cables, the impedance of the plasma, which is driven by the RF power, varies. In order to effectively transmit RF power from the RF generator and the coaxial cables to the plasma chamber, the impedance of the plasma chamber must be transformed to non-reactive 50 Ohms (i.e., 50+j0). Doing so will help maximize the amount of RF power transmitted into the plasma chamber.

The typical RF matching network includes variable capacitors and a control circuit with a microprocessor to control the capacitance values of the variable capacitors. Although several different configurations for RF matching networks are known, for simplicity, the remainder of the description will be in the context of one form of 'L' type RF matching network, with the understanding that one of skill in the art may apply the same principles to other types of RF matching networks.

The value and size of the variable capacitors within the RF matching network are determined by the power handling capability, frequency of operation, and impedance range of the plasma chamber. The predominant type of variable capacitor used in RF matching network applications is a Vacuum Variable Capacitor (VVC). The VVC is an electro-mechanical device, having two concentric metallic rings that are moved in relation to each other to change capacitance. In complex semiconductor fabrication processes using plasma chambers, where the impedance changes are often frequent, the frequent adjustments needing to be made to a VVC leads to mechanical failures, often within less than a year of use for individual VVCs. Failure of a VVC leads to downtime for fabrication equipment so that the failed VVC can be replaced. Due to a desire to eliminate points of mechanical failure in the semiconductor fabrication process, it is unsurprising that the VVCs in RF matching networks are one of the last electromechanical components that remain in wide use in the semiconductor fabrication process.

As semiconductor devices shrink in size and become more complex, the feature geometries become very small. As a result, the processing time for each individual step needed to fabricate these small features has likewise been reduced-typically in the range of 5~6 s. RF matching networks which use VVCs generally take in the range of 1~2 s to match the plasma chamber impedance to the RF generator impedance. During a significant amount of the matching process, which includes the microprocessor determining the capacitances for the VVCs needed to create the match, controlling the VVCs to the achieve the determined capacitances, and then finally time for the RF matching network circuits to stabilize with the new capacitances, the fabrication process parameters are unstable, and these unstable process parameters must be accounted for as part of the overall fabrication process. Because the matching process time is becoming a more and more significant part of the time for each fabrication process step, the period in which process parameters are unstable becomes more of a factor in the overall fabrication process.

While Electronically Variable Capacitor (EVC) technology is known (see U.S. Pat. No. 7,251,121, the disclosure of which is incorporated herein by reference in its entirety), it has yet to be developed into an industry-accepted replacement for VVCs. However, because an EVC is purely an electronic device, an EVC is not a one-for-one replacement for a VVC in an RF matching network. Further advancements are therefore needed to more fully take advantage of using EVCs as part of an RF matching network.

SUMMARY OF THE INVENTION

The present invention is directed toward an RF impedance matching network which utilizes electronically variable capacitors (EVCs) to reduce the time it takes to create an impedance match. Such an RF impedance matching network is advantageously employed in semiconductor fabrication systems and processes.

In a first aspect of the present invention, a radio frequency impedance matching network includes an RF input configured to operably couple to an RF source; an RF output configured to operably couple to a plasma chamber having a variable impedance; a first electronically variable capacitor having a first variable capacitance; a second electronically variable capacitor having a second variable capacitance; and a control circuit operably coupled to the first electronically variable capacitor and to the second electronically variable capacitor to control the first variable capacitance and the second variable capacitance, wherein the control circuit is configured to determine the variable impedance of the plasma chamber; determine a first capacitance value for the first variable capacitance and a second capacitance value for the second variable capacitance; and generate a control signal to alter at least one of the first variable capacitance and the second variable capacitance to the first capacitance value and the second capacitance value, respectively; wherein an elapsed time between determining the variable impedance of the plasma chamber to when RF power reflected back to the RF source decreases is less than about 150 μsec.

In a second aspect of the present invention, a method of matching an impedance includes determining, by an impedance matching network, a variable impedance of a plasma chamber, the impedance matching network comprising an RF input configured to operably couple to an RF source, an RF output configured to operably couple to the plasma chamber, a first electronically variable capacitor having a first variable capacitance, and a second electronically variable capacitor having a second variable capacitance; determining a first variable capacitance value and a second variable capacitance value for, respectively, the first electronically variable capacitor and the second electronically variable capacitor, for creating an impedance match at the RF input of the impedance matching network; and altering at least one of the first variable capacitance and the second variable capacitance to the first capacitance value and the second capacitance value, respectively, wherein an elapsed time between determining the variable impedance of the plasma chamber to when RF power reflected back to the RF source decreases is less than about 150 μsec.

In a third aspect of the present invention, a method of manufacturing a semiconductor includes placing a substrate in a plasma chamber configured to deposit a material layer onto the substrate or etch a material layer from the substrate; and energizing plasma within the plasma chamber by coupling RF power from an RF source into the plasma chamber to perform a deposition or etching, and while energizing the plasma determining, by an impedance matching network, a variable impedance of the plasma chamber, the impedance matching network comprising an RF input configured to operably couple to the RF source, an RF output configured to operably couple to the plasma chamber, a first electronically variable capacitor having a first variable capacitance, and a second electronically variable capacitor having a second variable capacitance; determining a first variable capacitance value and a second variable capacitance value for, respectively, the first electronically variable capacitor and the second electronically variable capacitor, for creating an impedance match at the RF input of the impedance matching network; and altering at least one of the first variable capacitance and the second variable capacitance to the first capacitance value and the second capacitance value, respectively, wherein an elapsed time between determining the variable impedance of the plasma chamber to when RF power reflected back to the RF source decreases is less than about 150 μsec.

Accordingly, an improved RF impedance matching network, along with systems and methods incorporating the improved RF impedance matching network, is disclosed. Advantages of the improvements will be apparent from the drawings and the description of the preferred embodiment.

BRIEF DESCRIPTION OF THE DRAWINGS

The foregoing summary, as well as the following detailed description of the exemplary embodiments, will be better understood when read in conjunction with the appended drawings. It should be understood, however, that the invention is not limited to the precise arrangements and instrumentalities shown in the following figures.

DETAILED DESCRIPTION OF THE INVENTION

The description of illustrative embodiments according to principles of the present invention is intended to be read in connection with the accompanying drawings, which are to be considered part of the entire written description. In the description of embodiments of the invention disclosed herein, where circuits are shown and described, one of skill in the art will recognize that for the sake of clarity, not all desirable or useful peripheral circuits and/or components are shown in the figures or described in the description. Moreover, the features and benefits of the invention are illustrated by reference to the disclosed embodiments. Accordingly, the invention expressly should not be limited to such disclosed embodiments illustrating some possible non-limiting combinations of features that may exist alone or in other combinations of features; the scope of the invention being defined by the claims appended hereto.

Figure 1:
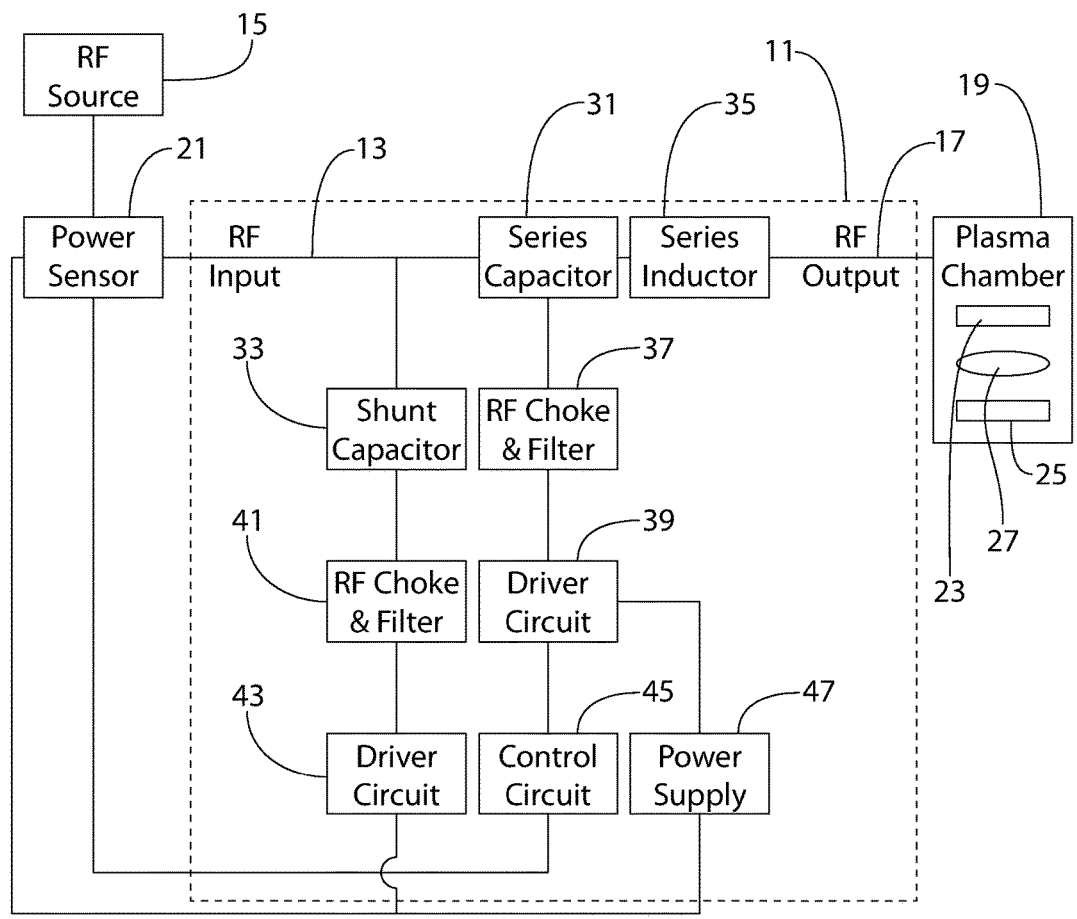
FIG. 1 is a schematic representation of an embodiment of an RF impedance matching network using EVCs incorporated into a semiconductor wafer fabrication system.

Turning in detail to the drawings, FIG. 1 illustrates an RF impedance matching network 11 having an RF input 13 connected to an RF source 15 and an RF output 17 connected to a plasma chamber 19. A power sensor 21 is connected between the RF impedance matching network 11 and the RF source 15 so that the RF signal output from the RF source 15 may be monitored. The RF impedance matching network 11 serves to help maximize the amount of RF power transferred from the RF source 15 to the plasma chamber 19 by matching the impedance at the RF input 13 to the fixed impedance of the RF source 15.

As is known in the art, the plasma within a plasma chamber typically undergoes certain fluctuations outside of operational control so that the impedance presented by the plasma chamber is a variable impedance. Since the variable impedance of the plasma chamber cannot be fully controlled, and an impedance matching network may be used to create an impedance match between the plasma chamber and the RF source. Moreover, the impedance of the RF source may be fixed at a set value by the design of the particular RF source. Although the fixed impedance of an RF source may undergo minor fluctuations during use, due to, for example, temperature or other environmental variations, the impedance of the RF source is still considered a fixed impedance for purposes of impedance matching because the fluctuations do not significantly vary the fixed impedance from the originally set impedance value. Other types of RF source may be designed so that the impedance of the RF source may be set at the time of, or during, use. The impedance of such types of RF sources is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

The RF impedance matching network 11 includes a series variable capacitor 31, a shunt variable capacitor 33, and a series inductor 35 configured as one form an 'L' type matching network. In particular, the shunt variable capacitor 33 is shown shunting to ground between the series variable capacitor 31 and the series inductor 35, and one of skill in the art will recognize that the RF impedance matching network 11 may be configured with the shunt variable capacitor 33 shunting to ground at the RF input 13 or at the RF output 17. Alternatively, the RF impedance matching network 11 may be configured in other matching network configurations, such as a 'T' type configuration or a 'Π' type configuration. In certain embodiments, the variable capacitors and the switching circuit described below may be included in any configuration appropriate for an RF impedance matching network.

Each of the series variable capacitor 31 and the shunt variable capacitor 33 may be an electronic variable capacitor (EVC), as described in U.S. Pat. No. 7,251,121. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground. In other configurations, the shunt variable capacitor 33 may be coupled in parallel between the RF output 19 and ground. Other configurations may also be implemented without departing from the functionality of an RF matching network.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate microprocessor and/or signal generating circuitry to provide an input signal for controlling the series and shunt driver circuits 39, 43. A power supply 47 is connected to each of the power sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the power sensor 21, the series driver circuit 39, the shunt driver circuit 43, and the control circuit 45 to perform the respective designated tasks, is a matter of design choice.

With the combination of the series variable capacitor 31 and the shunt variable capacitor, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the power sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type that are known to those of skill in the art.

Figure 2:
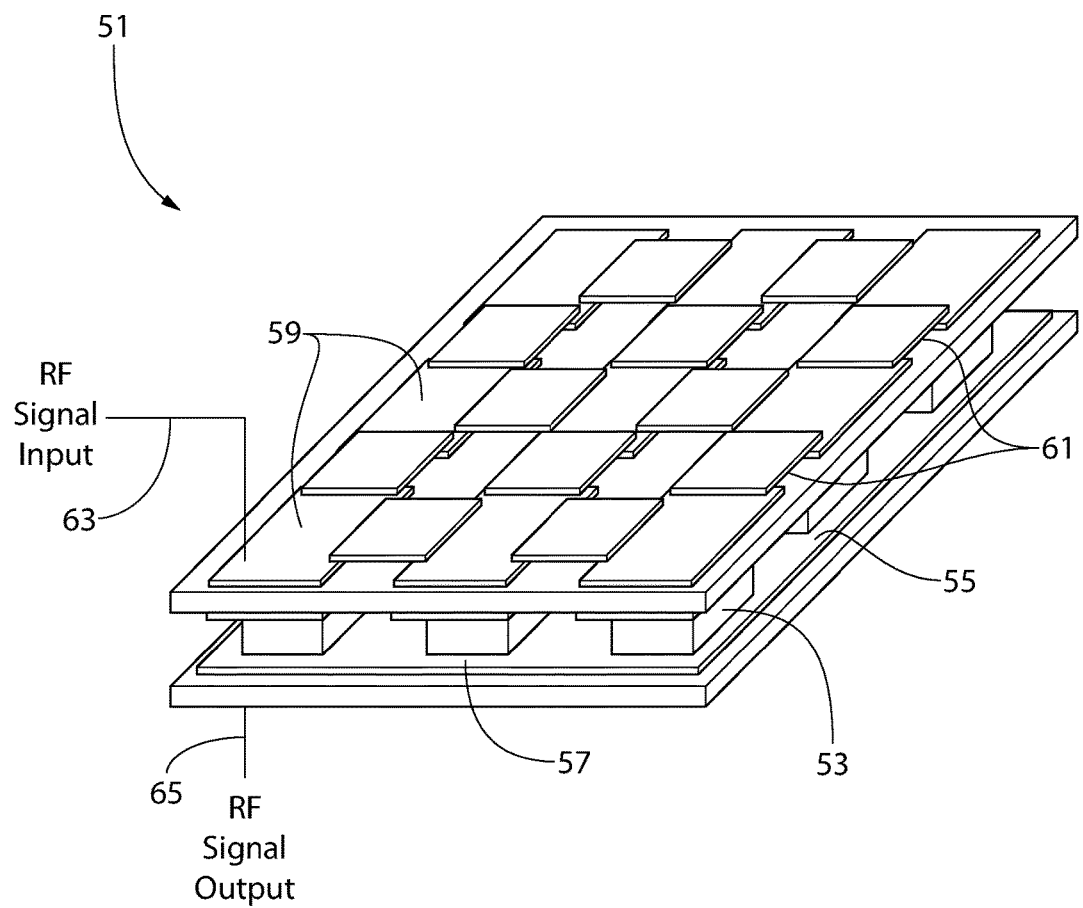
FIG. 2 illustrates an EVC for use in an RF impedance matching network.

The series and shunt variable capacitors 31, 33 may each be an electronically variable capacitor 51 such as is depicted in FIG. 2. The electronically variable capacitor 51 includes a plurality of discrete capacitors 53, each of which has an electrode on opposite sides thereof, such as is typical of discrete capacitors that are available on the market.

Each discrete capacitor 53 has its individual bottom electrode 55 electrically connected to a common bottom electrode 57. The individual top electrode 59 of each discrete capacitor 53 is electrically connected to the individual top electrode 59 of adjacent discrete capacitors 53 through an electronic switch 61 that may be activated to electrically connect the adjacent top electrodes 59. Thus, the individual top electrodes 59 of each discrete capacitor 53 may be electrically connected to the top electrodes 59 of one or more adjacent discrete capacitors 53. The electronic switch 61 is selected and/or designed to be capable of switching the voltage and current of the RF signal. For example, the electronic switch 61 may be a PiN/NiP diode, or a circuit based on a PiN/NiP diode. Alternatively, the electronic switch 61 may be any other type of appropriate switch, such as a micro electro mechanical (MEM) switch, a solid state relay, a field effect transistor, and the like. One embodiment of the electronic switch 61, in combination with a driver circuit, is discussed in greater detail below.

In the configuration of the electronically variable capacitor 51 shown, each individual top electrode 59 may be electrically connected to between two to four adjacent top electrodes 59, with each connection being independently regulated by a separate electronic switch 61. The RF signal input 63 is electrically connected to one of the individual top electrodes 59, and the RF signal output 65 is electrically connected to the common bottom electrode 57. Thus, the electronic circuit through which the RF signal passes may include one, some, or all of the discrete capacitors 53 by a process of independently activating one or more of the electronic switches 61 coupled to adjacent ones of the individual top electrodes 59.

In other embodiments, the electronically variable capacitor 51 may be configured to have any layout for the individual top electrodes 59, to thereby increase or decrease the number of possible electrical connections between adjacent top electrodes 59. In still other embodiments, the electronically variable capacitor 51 may have an integrated dielectric disposed between the bottom electrode 57 and a plurality of top electrodes 59.

The electronic switch 61 that is used to connect pairs of adjacent top electrodes 59 may be a PiN/NiP diode-based switch, although other types of electronic switches may be used, such as a Micro Electro Mechanical (MEM) switch, a solid state relay, a field effect transistor, and the like. Each electronic switch 61 is switched by appropriate driver circuitry. For example, each of the series and shunt driver circuits 39, 43 of FIG. 1 may include several discrete driving circuits, with each discrete driving circuit configured to switch one of the electronic switches 61.

Figure 3:
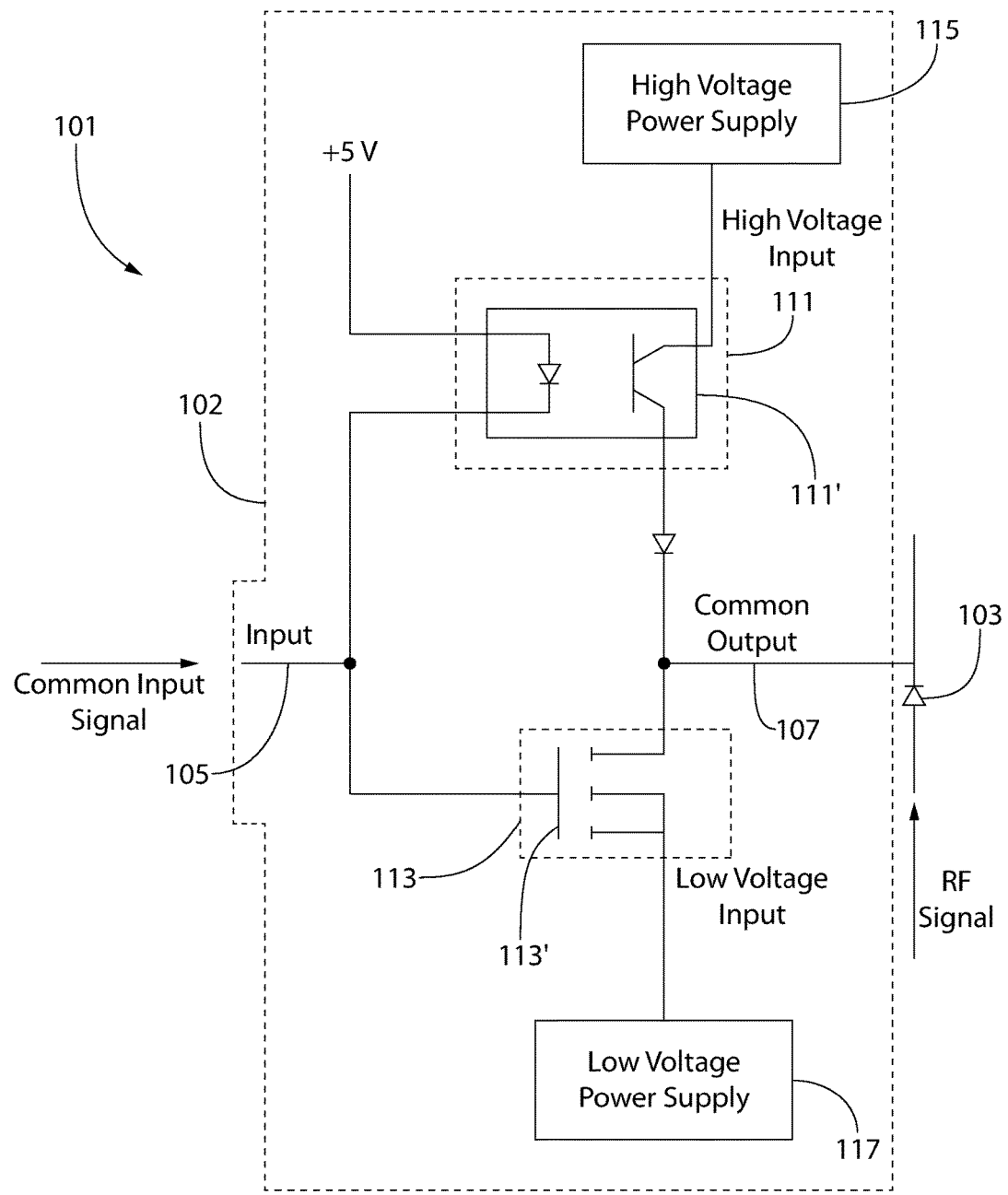
FIG. 3 illustrates a first switching circuit for use with an EVC.

FIG. 3 shows an embodiment of a high voltage switching circuit 101, which is shown including a driver circuit 102 and a PiN/NiP diode 103 as an electronic switch. Although this switching circuit is shown with the driver circuit 102 integrated with the PiN/NiP diode 103, one of skill in the art will understand that in practice, the PiN/NiP diode 103, or any other type of electronic switch, may be integrated with the discrete capacitors in an EVC that is part of an RF impedance matching network, with the RF choke and filter circuit connected between the output of the driver circuit 102 and the PiN/NiP diode 103.

The switching circuit 101 may be used for switching one of the discrete capacitors in an EVC between an 'ON' state and an 'OFF' state. One of skill in the art will recognize that the use of the PiN/NiP diode 103 in this embodiment is exemplary, and that the switching circuit 101 may include other types of circuitry that does not include the PiN/NiP diode 103, yet still provides some of the same fast switching advantages of the PiN/NiP diode 103 for switching one of the discrete capacitors in an EVC. One of skill in the art will also recognize that certain components of the driver circuit 102 may be replaced with other components that perform the same essential function while also greater allowing variability in other circuit parameters (e.g. voltage range, current range, and the like).

This driver circuit 102 has an input 105 which receives a common input signal for controlling the voltage on the common output 107 that is connected to and drives the PiN/NiP diode 103. The voltage on the common output 107 switches the PiN/NiP diode 103 between the 'ON' state and the 'OFF' state, thus also switching 'ON' and 'OFF' the discrete capacitor to which the PiN/NiP diode 103 is connected. The state of the discrete capacitor, in this exemplary embodiment, follows the state of the state of the PiN/NiP diode 103, such that when the PiN/NiP diode 103 is 'ON', the discrete capacitor is also 'ON', and likewise, when the PiN/NiP diode 103 is 'OFF', the discrete capacitor is also 'OFF'. Thus, statements herein about the state of the PiN/NiP diode 103 inherently describe the concomitant state of the connected discrete capacitor of the EVC.

The input 105 is connected to both a first power switch 111 and into a second power switch 113. As depicted, the first power switch 111 is an optocoupler phototransistor 111', and the second power switch 113 is a MOSFET 113'. A high voltage power supply 115 is connected to the first power switch 111, providing a high voltage input which is to be switchably connected to the common output 107. A low voltage power supply 117 is connected to the second power switch 113, providing a low voltage input which is also to be switchably connected to the common output 107. In the configuration of the driver circuit 102 shown, the low voltage power supply 117 may supply a low voltage input which is about −5 V. Such a low voltage, with a negative polarity, is sufficient to provide a forward bias for switching the PiN/NiP diode 103. For other configurations of the driver circuit 102, a higher or lower voltage input may be used, and the low voltage input may have a positive polarity, depending upon the configuration and the type of electronic switch being controlled.

The common input signal asynchronously controls the 'on' and 'off' states of the first power switch 111 and the second power switch 113, such that when the first power switch 111 is in the 'on' state, the second power switch 113 is in the 'off' state, and similarly, when the first power switch is in the 'off' state, the second power switch 113 is in the 'on' state. In this manner, the common input signal controls the first power switch 111 and the second power switch 113 to asynchronously connect the high voltage input and the low voltage input to the common output for purposes of switching the PiN/NiP diode 103 between the 'ON' state and the 'OFF' state.

The input 105 may be configured to receive any type of appropriate control signal for the types of switches selected for the first power switch 111 and the second power switch 113, which may be, for example, a +5 V control signal. Of course, to maintain simplicity of the overall driver circuit 102 and avoid incurring additional manufacturing costs, the first and second power switches 111, 113 are preferably selected so that they may directly receive the common input signal without requiring additional circuitry to filter or otherwise transform the common input signal.

The switching circuit 101 has design features which make it particularly useful for switching between a high voltage input and a low voltage input on the common output quickly and without the need to float the drive circuit, with respect to the high voltage input, or require use of special gate charging circuits due to isolation of the input signal from the high voltage input. Another advantage of the switching circuit 101 is that it provides the ability to switch the common output between voltage modes quickly, within the time frame of about 15 μsec or less. The simplicity of the switching circuit 101 should considerably reduce manufacturing costs, especially when compared to other circuits performing similar functionality, and it should also significantly reduce space requirements for the circuit, and again, especially as compared to other circuits performing similar functionality. These advantages make the switching circuit 101 particularly advantageous with the incorporated PiN/NiP diode 103.

One of the ways in which these advances are realized is the first power switch 111 being a monolithic circuit element, such as the optocoupler phototransistor 111'. A monolithic element reduces both cost and space requirements.

When an optocoupler phototransistor 111' is used as the monolithic element, it can perform the necessary high voltage switching quickly, and it serves to isolate the high voltage input from the common input signal. Other, as yet unrealized advantages may also be present through the use of an optocoupler phototransistor 111'.

An optocoupler phototransistor 111' serves well as the first power switch 111 for use in conjunction with the PiN/NiP diode 103 because of the low current requirements for the PiN/NiP diode 103 when in the 'OFF' state. During the 'OFF' state, the PiN/NiP diode 103 is reverse biased, and thus non-conducting, and as such the 'OFF' state current requirement falls within the current handling capability of most optocoupler phototransistors. In addition, in implementations when one or both of the voltage requirements or the current requirements exceed the specifications for a single optocoupler phototransistor, additional optocoupler phototransistors may be added into the circuit in series or in parallel to increase the voltage and/or current handling capabilities of the switching circuit.

To further highlight the advantages of the switching circuit 101, its operation is detailed when the first power switch 111 is an optocoupler phototransistor 111' and the second power switch 113 is an appropriate MOSFET 113'. In this example, the common input signal may be a 5 V control signal which is alternated between a first voltage level and a second voltage level that serve to switch both the optocoupler phototransistor 111' and the MOSFET 113' between 'on' and 'off' states. The manner of implementing a 5 V control signal is well known to those of skill in the art.

When the PiN/NiP diode 103 is to be turned to the 'OFF' state, the optocoupler phototransistor 111' is turned to the 'on' state by applying the first voltage level from the common input signal across the photodiode inputs of the optocoupler phototransistor 111'. Turning the optocoupler phototransistor 111' to the 'on' state connects high voltage input to the common output 107, thereby reverse biasing the PiN/NiP diode 103. At the same time, during this 'OFF' state of the PiN/NiP diode 103, application of the first voltage level from the common input signal to the MOSFET 113' places the MOSFET 113' in the 'off' state, thereby disconnecting low voltage input from the common output 107.

When the PiN/NiP diode 103 is to be turned to the 'ON' state, the optocoupler phototransistor 111' is turned to the 'off' state by applying the second voltage level from the common input signal across the photodiode inputs of the optocoupler phototransistor 111'. Turning the optocoupler phototransistor 111' to the 'off' state disconnects high voltage input from the common output 107. At the same time, application of the second voltage level from the common input signal to the MOSFET 113' places the MOSFET 113' in the 'on' state, thereby connecting the low voltage input to the common output 107. With the MOSFET 113' in the 'on' state, and the optocoupler phototransistor 111' to the 'off' state, only the low voltage input is connected to the common output 107, so that the PiN/NiP diode 103 is forward biased and placed in the 'ON' state.

As indicated above, the optocoupler phototransistor 111' provides the advantage that the common input signal is electrically isolated, through the internal optical switch (not shown) of the optocoupler phototransistor 111', from the switched high voltage, thus alleviating the need to float the drive circuit (such as when a MOSFET is used to switch the high voltage). Use of the optocoupler phototransistor 111' provides the additional advantage that the driver circuit 102 can quickly switch the common output 107 between the high voltage input and the low voltage input, with the switching occurring within the time frame of about 15 μsec or less. This fast switching time helps reduce switching loss, thereby reducing stress on the PiN/NiP diode itself, and introduces improvements in the semiconductor fabrication process by reducing the amount of time it takes for the RF impedance matching network to create an impedance match between the RF source and the plasma chamber.

The use of optocoupler phototransistors in the driver circuit 102 also provides advantages for switching a high voltage input in the range of 500 V-1000 V. Higher or lower voltages may also be switched with this driver circuit 102. The high voltage input may therefore differ from the low voltage input by at least two or three orders of magnitude, or more. Advantageously, when the switching circuit 101 incorporates the PiN/NiP diode 103, the high voltage input and the low voltage input may have opposite polarities.

Figure 4:
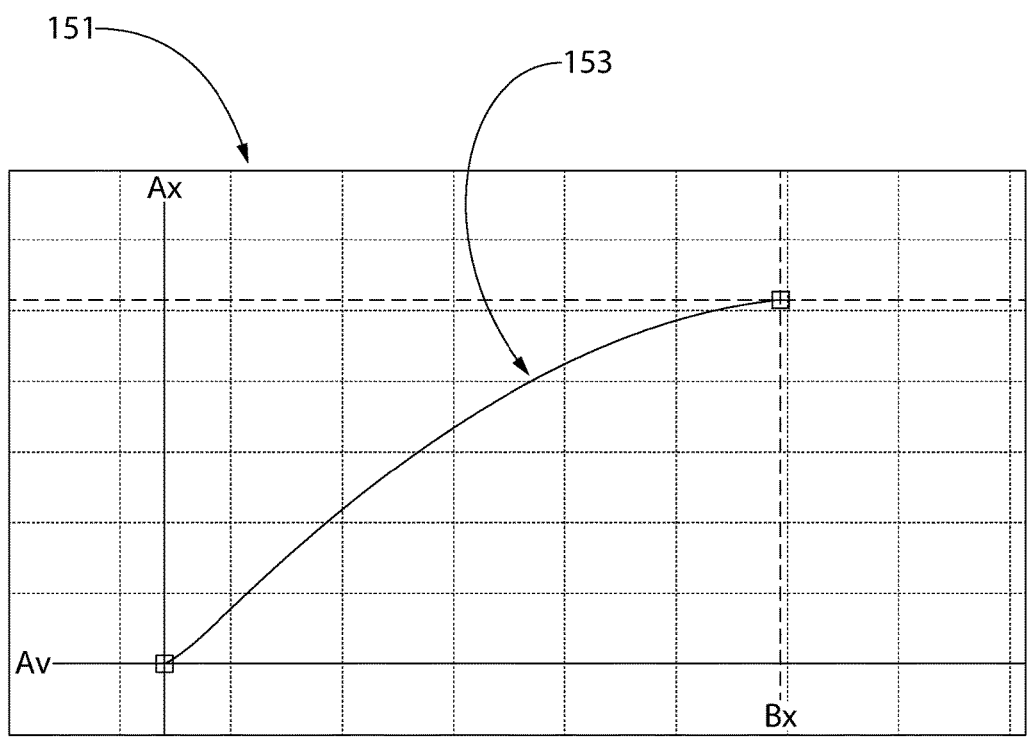
FIG. 4 is a graphical representation showing the timing capabilities of a driver circuit to switch to high voltage on the common output.
Figure 5:
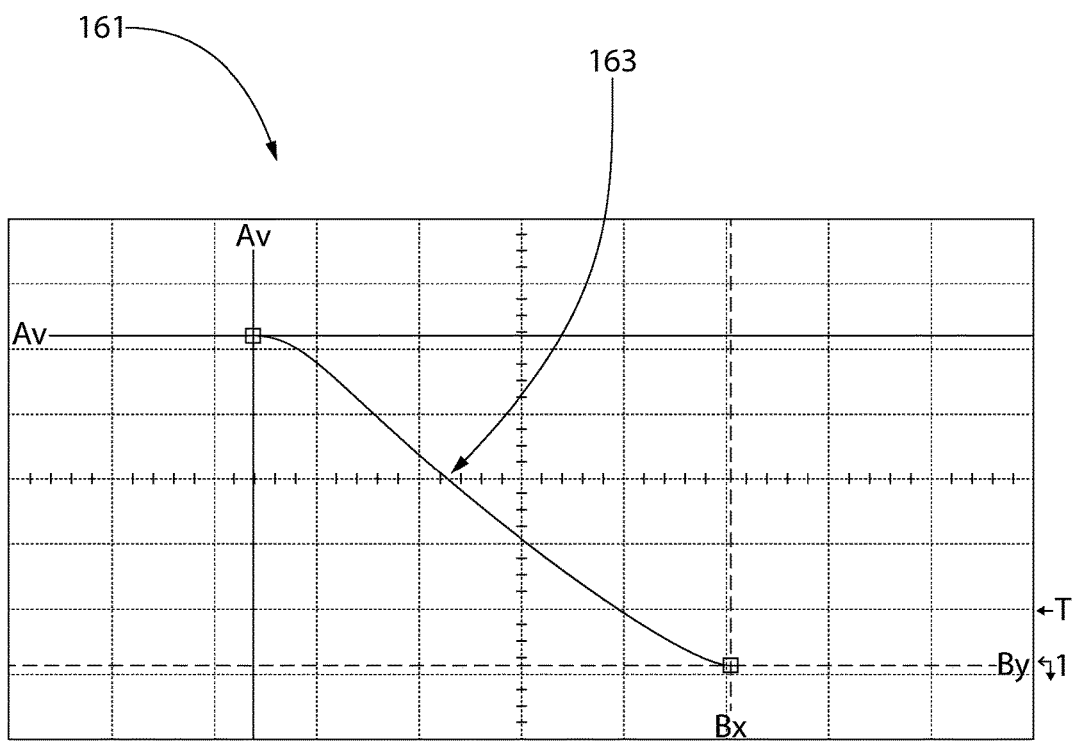
FIG. 5 is a graphical representation showing the timing capabilities of a driver circuit to switch to low voltage on the common output.

The ability of the driver circuit 102 to provide quick switching capabilities is exemplified by the graphs 151, 161 of FIGS. 4 and 5. The voltage curve 153 of FIG. 4 shows the voltage on the common output 107 of the driver circuit 102 in order to switch the connected PiN/NiP diode 103 to the 'OFF' state. As is shown by the voltage curve 153, the driver circuit 102 is capable of switching to connect the high voltage input, which in this example is approximately 1,000 V, to the common output 107 within about 11 μsec. The voltage curve 163 of FIG. 5 shows the voltage on the common output 107 of the driver circuit 102 in order to switch the connected PiN/NiP diode 103 to the 'ON' state. As is shown by the voltage curve 163, the driver circuit 102 is capable of switching to connect the low voltage input, which in this example is approximately −12 V, to the common output 107 within about 9 μsec. Thus, an RF impedance matching network which includes EVCs and switching circuits, as described above, shows significant improvements as compared to an RF impedance matching network which includes VVCs.

Figure 6:
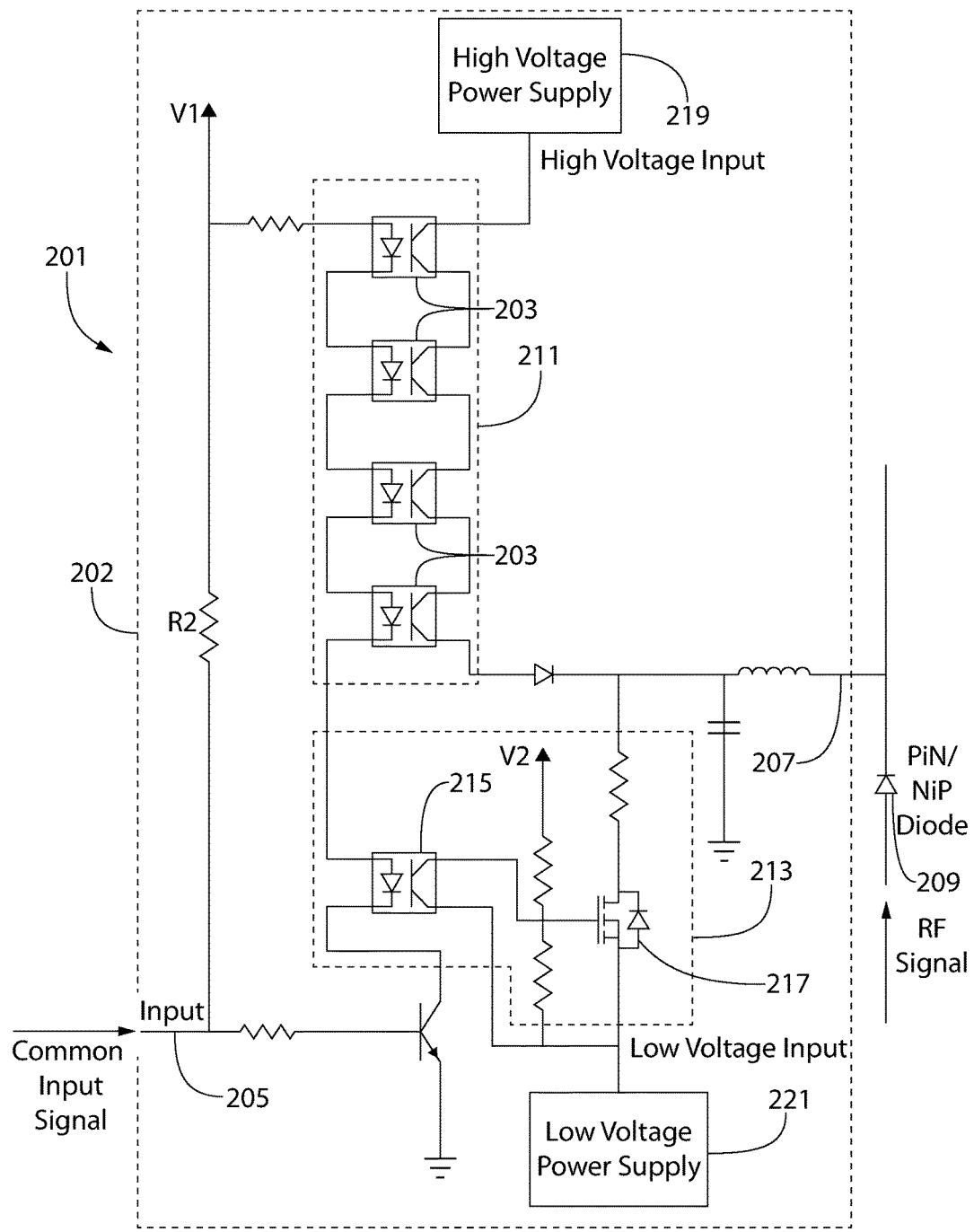
FIG. 6 illustrates a second switching circuit for use with an EVC.

A switching circuit 201 which includes a driver circuit 202 having multiple optocoupler phototransistors 203 to increase the high voltage capabilities is shown in FIG. 6. Like the driver circuit 102 of FIG. 3, this driver circuit 202 includes an input 205 which receives a common input signal for controlling the voltage on the common output 207. The switching circuit 201 includes a PiN/NiP diode 209 connected to the common output 207, and the voltage on the common output 207 may be used to switch the PiN/NiP diode 209 between 'ON' state and 'OFF' states. The input 205 is connected to both a first power switch 211, which includes the optocoupler phototransistors 203, and to a second power switch 213, which includes another optocoupler phototransistor 215 and a MOSFET 217.

A high voltage power supply 219 is connected to the first power switch 211, providing a high voltage input which is to be switchably connected to the common output 207. A low voltage power supply 221 is connected to the second power switch 213, providing a low voltage input which is also to be switchably connected to the common output 207.

The optocoupler phototransistors 203 of the first power switch 211 are connected in series to each other in order to enable the first power switch 211 to switch higher voltages onto the common output 207 in the same manner as discussed above with a single optocoupler phototransistor. With appropriate selection of the optocoupler phototransistors 203, the first power switch 211, as shown, is capable of switching about 1000 V or more from the high voltage power supply 219 to the common output 207. Additional optocoupler phototransistors may be added in series for the first power switch 211 to increase the high voltage switching capabilities. One of skill in the art will recognize that one or more optocoupler phototransistors may be connected in parallel to each other to increase the current load capabilities of the first power switch 211. One optocoupler phototransistor may be used to switch low voltages through the design rating of the optocoupler phototransistor, with more optocoupler phototransistors being added to switch higher voltages.

The optocoupler phototransistor 215 of the second power switch 213 receives the common input signal, like the optocoupler phototransistors 203 of the first power switch 211. This optocoupler phototransistor 215 is connected to the MOSFET 217 and places the MOSFET 217 in the 'off' state by connecting the source to the gate when the common input signal places the first power switch 211 in the 'on' state. In this configuration, when the MOSFET 217 is in the 'on' state, the second power switch 213 is also in the 'on' state, connecting the low power input to the common output 207. Likewise, when the MOSFET 217 is in the 'off' state, the second power switch 213 is also in the 'off' state, so that the low power input is disconnected from the common output 207. When the first power switch is in the 'off' state, optocoupler phototransistor 215 disconnects the gate from the source, so that the MOSFET 217 placed in the 'on' state by the gate being connected to the voltage V2, which is an appropriate voltage for controlling the gate of the MOSFET 217.

Figure 7:
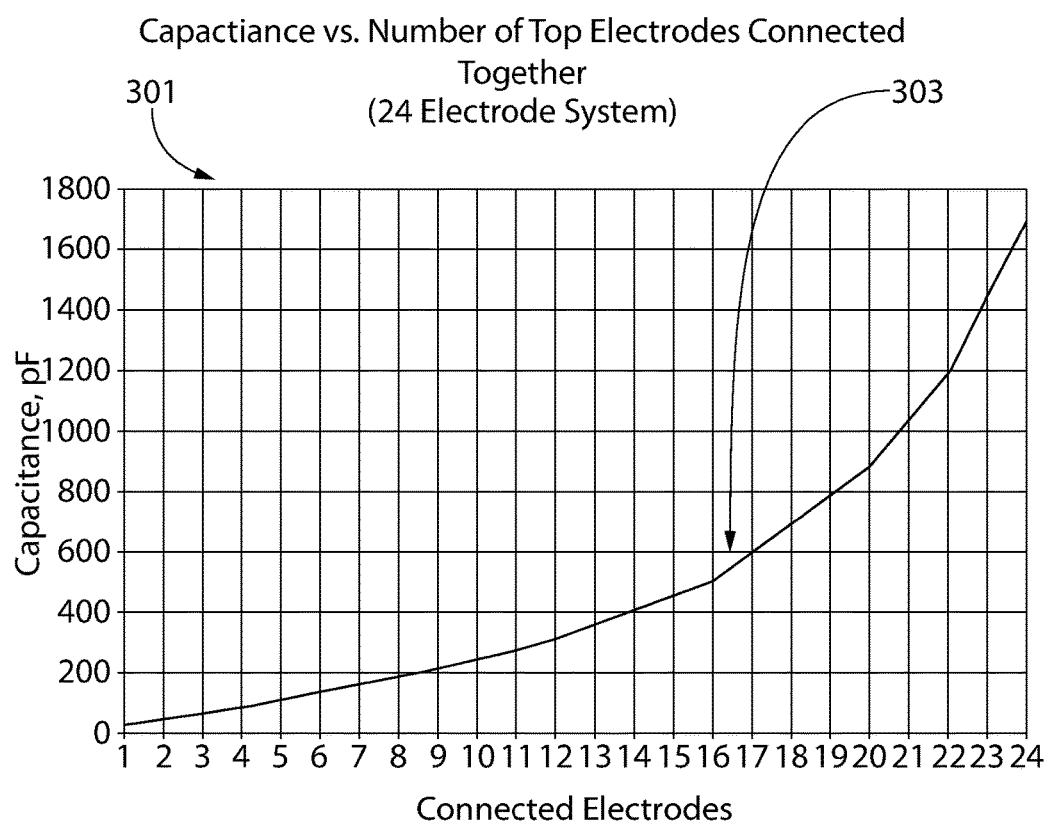
FIG. 7 is a graph showing the capacitance range of an EVC.

The non-linear capacitance range of a single EVC switched by a switching circuit is shown in the graph 301 of FIG. 7. The single EVC used to generate the capacitance curve 303 has 24 discrete capacitors in the manner described above, with the top electrodes of the discrete capacitors being selectively connected to arrive at the capacitance curve 303 shown. As can be seen, the single EVC may provide a capacitance ranging from only one active discrete capacitor (i.e., none of the top electrodes of any of the discrete capacitors are connected, so that the RF signal only flows through a single discrete capacitor) to all 24 discrete capacitors being active (i.e., all the top electrodes of all the discrete capacitors are connected). Any number of the 24 discrete capacitors may be connected, so that the capacitance of the single EVC may range from a low capacitance, with one active discrete capacitor, to a high capacitance, with all 24 discrete capacitors active. The low capacitance and the high capacitance are a matter of design choice for the EVC. In the capacitance curve shown, the low capacitance is about 25 pF, while the high capacitance is over 1,600 pF. The number of discrete capacitance values that is achievable between the low capacitance and the high capacitance is also a matter of design choice for the EVC, as more or fewer discrete capacitors may be included as part of the EVC. The only significant constraints on an EVC are the mechanical limitations posed by specific implementations (e.g., size or weight restrictions on the EVC). Mechanical limitations aside, an EVC does not appear to have any issues for achieving high value capacitance (e.g., 200,000 pF or higher).

Figure 8:
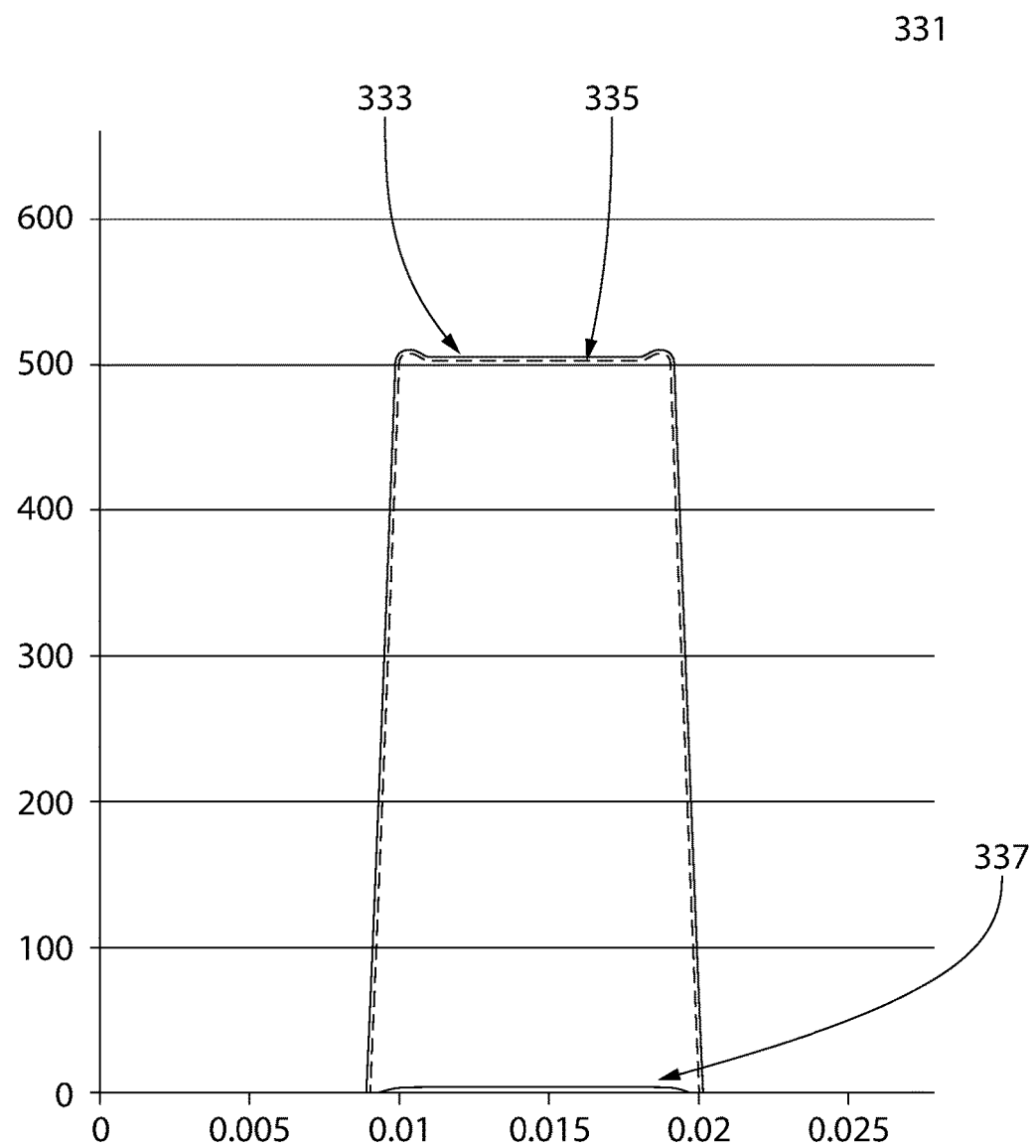
FIG. 8 is a graph showing the stable delivered power and the low reflected power that an impedance matching network including EVCs may provide during tuning.

The stable delivered power of an RF impedance matching network incorporating EVCs is shown in the graph 331 of FIG. 8, which does not show or take into account switching capabilities of an EVC controlled by a switching circuit. There are three curves shown in this graph 331: the output power 333 of the RF signal output from the RF source, which is about 500 V; the delivered power 335 to the plasma chamber; and the reflected power 337 back to the RF source. The output power 333 is a little over 500 V, while the reflected power 337 is in the range of about 10 V, so that the delivered power 335 to the plasma chamber is about 500 V. Not only is the delivered power 335 about 98% of the output power 333, but the delivered power 335, as can be seen, is substantially stable, without significant fluctuations. Both the percentage of delivered power 335 and the stability of the delivered power 335 represent significant improvements over an RF impedance matching network that is based on VVCs.

Figure 9:
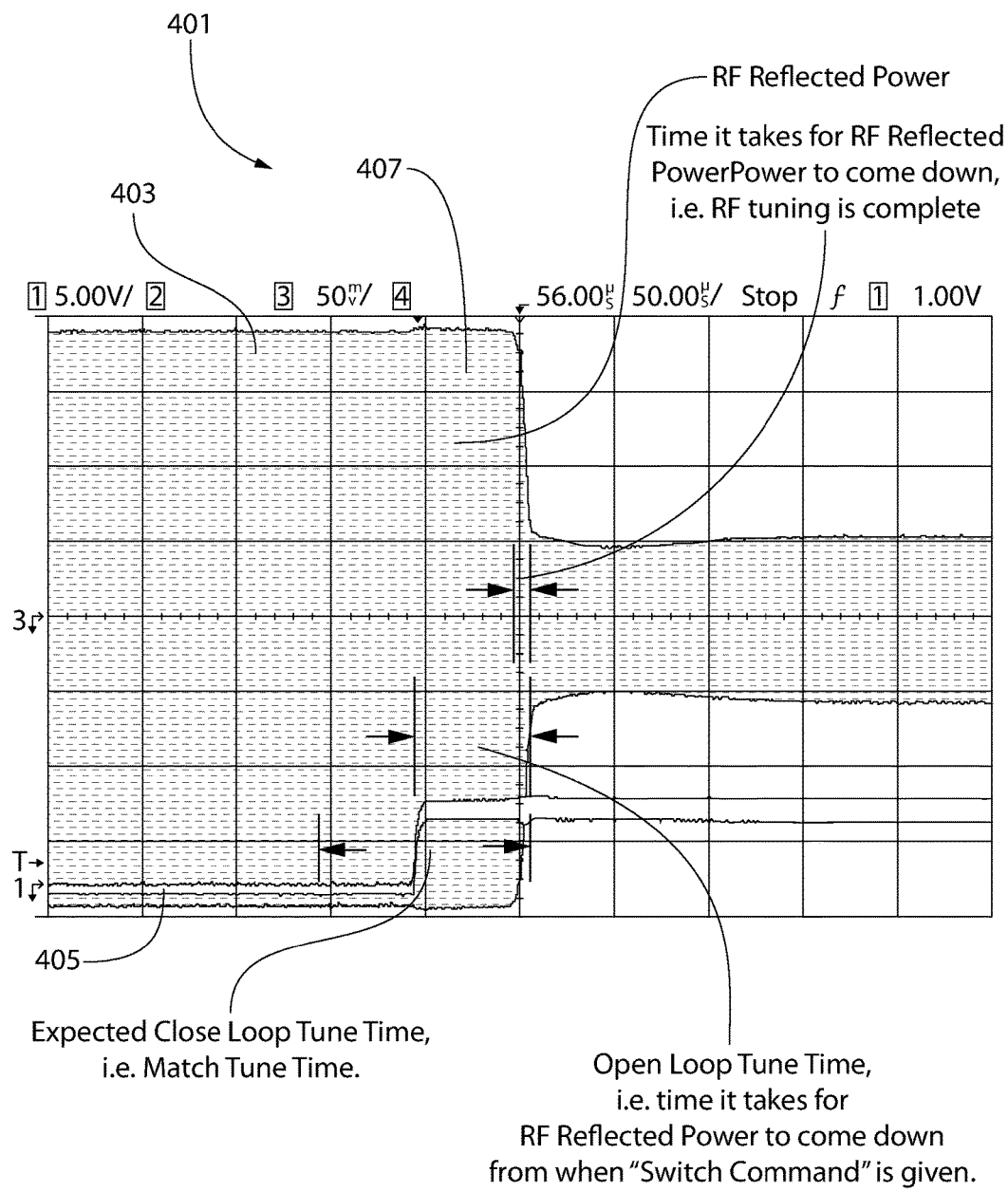
FIG. 9 is a graphical representation showing the reflected RF power profile through an RF impedance matching network using EVCs and showing the voltage supplied to the driver circuit for the EVCs.

When the switching capabilities of an EVC controlled by a switching circuit, in the manner described above, are incorporated into an RF impedance matching network, high speed switching is enabled for the RF impedance matching network. FIG. 9 is a graph 401 having voltage along the two y-axes and time along the x-axis to show the speed at which an RF impedance matching network using EVCs performs impedance matching (also referred to as the "match tune process"). A representation of an RF power profile 403 is shown, taken at the RF input of an RF impedance matching network, and the y-axis for the RF power profile has 50 mV divisions. A representation of the voltage of the common input signal 405 for driver circuits is also shown in the lower portion of the graph 401, the common input signal 405 originating from the control circuit of the RF impedance matching network, and the y-axis for the common input signal 405 has 5 V divisions. The x-axis has 50 μsec divisions, with the 56 μsec point marked in approximately the middle of the graph and the t=0 point as marked.

Initially, a significant amount of reflected power 407 is shown in the left portion of the RF power profile 403 (i.e., before the 56 μsec mark). This reflected power represents inefficiencies in the RF power being transferred between the RF source and the plasma chamber as a result of an impedance mismatch. At about t=−36 μsec, the match tune process begins. The first approximately 50 μsec of the match tune process is consumed by measurements and calculations performed by the control circuit in order to determine new values for the variable capacitances of one or both of the series and shunt EVCs. As part of this initial step of the process, the control circuit uses the power output of the RF source, the current of the RF signal, and the known settings of the series and shunt variable capacitors to determine the current variable impedance of the plasma chamber. Once the variable impedance of the plasma chamber is known, the control circuit can then determine the changes to make to the variable capacitances of one or both of the series and shunt variable capacitors for purposes of achieving an impedance match. Specifically, the control circuit may determine a first capacitance value for the first variable capacitance of the series variable capacitor and determine a second capacitance value for the second variable capacitance of the shunt variable capacitor. These calculations are performed for purposes of creating an impedance match, or at least a substantial impedance match. At approximately t=−5 μsec, the control circuit triggers the switching circuit to alter the variable capacitance of one or both of the series or shunt EVCs. To trigger the switching circuit, the control circuit generates a control signal to which serves to cause the control circuits to alter at least one of the first variable capacitance and the second variable capacitance to the first capacitance value and the second capacitance value.

This alteration of the EVCs takes about 9-11 μsec total, as compared to about 1-2 sec of time for an RF matching network using VVCs. Once the switch to the different variable capacitances is complete, there is a period of latency as the additional discrete capacitors that make up the EVCs join the circuit and charge. This part of the match tune process takes about 55 μsec. Finally, the RF power profile 403 is shown decreasing, at just before t=56 μsec, from about 380 mV peak-to-peak to about 100 mV peak-to-peak. This decrease in the RF power profile 403 represents the decrease in the reflected power 407, and it takes place over a time period of about 10 μsec, at which point the match tune process is considered complete.

From the beginning of the match tune process, which starts with the control circuit determining the variable impedance of the plasma chamber and determining the first and second variable capacitances, to the end of the match tune process, when the RF power reflected back toward the RF source decreases, the entire match tune process of the RF impedance matching network using EVCs has an elapsed time of approximately 110 μsec, or on the order of about 150 μsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the variable capacitances of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 μsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the configuration and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 μsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 μsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
|---|---|---|
| Capacitance | 20 pF~1400 pF | 15 pF~1000 pF |
| Reliability | High | Low |
| Response Time | ~500 μsec | 1 s~2 s |
| ESR | ~13 mW | ~20 mW |
| Voltage | 7 kV | 5 kV |
| Current Handling Capability | 216 A rms | 80 A rms |
| Volume | 4.5 in³ | 75 in³ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.

The EVC has a compact size as compared to a VVC, so that the reduced weight and volume may save valuable space within a fabrication facility.

The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.

The short match tune process (~500 μsec or less) allows the RF impedance matching network to better keep up with plasma changes within the fabrication process, thereby increasing plasma stability and resulting in more controlled power to the fabrication process.

The use of EVCs, which are digitally controlled, non-mechanical devices, in an RF impedance matching network provides greater opportunity to fine tune control algorithms through programming.

EVCs exhibit superior low frequency (kHz) performance as compared to VVCs.

While the invention has been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present invention. Thus, the spirit and scope of the invention should be construed broadly as set forth in the appended claims.

What is claimed is:

1. A radio frequency (RF) impedance matching network comprising:

an RF input configured to operably couple to an RF source;

an RF output configured to operably couple to a plasma chamber having a variable impedance;

a first electronically variable capacitor having a first variable capacitance;

a second electronically variable capacitor having a second variable capacitance; and a control circuit operably coupled to the first electronically variable capacitor and to the second electronically variable capacitor to control the first variable capacitance and the second variable capacitance, wherein the control circuit is configured to:

determine the variable impedance of the plasma chamber;

determine a first capacitance value for the first variable capacitance and a second capacitance value for the second variable capacitance; and generate a control signal to alter at least one of the first variable capacitance and the second variable capacitance to the first capacitance value and the second capacitance value, respectively;

wherein an elapsed time between determining the variable impedance of the plasma chamber to when RF power reflected back to the RF source decreases is less than about 150 µsec.

2. The RF impedance matching network of claim 1 wherein the impedance match is created in about 500 µsec or less.

3. The RF impedance matching network of claim 1 further comprising:

a first driver circuit operably coupled between the control circuit and the first electronically variable capacitor, the first driver circuit being configured to alter the first variable capacitance based upon the control signal received from the control circuit;

a second driver circuit operably coupled between the control circuit and the second electronically variable capacitor, the second driver circuit being configured to alter the second variable capacitance based upon the control signal received from the control circuit;

a first RF filter operably coupled between the first electronically variable capacitor and the first driver circuit; and a second RF filter operably coupled between the second electronically variable capacitor and the second driver circuit.

4. The RF impedance matching network of claim 1 wherein the first electronically variable capacitor is operably coupled in series between the RF input and the RF output.

5. The RF impedance matching network of claim 4 wherein the first electronically variable capacitor and the second electronically variable capacitor are positioned to form a T type matching network, the second electronically variable capacitor being operably coupled in series between the RF input and the RF output.

6. The RF impedance matching network of claim 1 wherein the second electronically variable capacitor is operably coupled in parallel between a ground and one of the RF input and the RF output.

7. The RF impedance matching network of claim 6 wherein the first electronically variable capacitor and the second electronically variable capacitor are positioned to form a pi (Π) type matching network, the first electronically variable capacitor being operably coupled between a ground and one of the RF input and the RF output.

8. The RF impedance matching network of claim 1 wherein the determination of the first capacitance value for the first variable capacitance and the second capacitance value for the second variable capacitance is based on the determined variable impedance of the plasma chamber.

9. A method of matching an impedance, the method comprising:

determining, by an impedance matching network, a variable impedance of a plasma chamber, the impedance matching network comprising an RF input configured to operably couple to an RF source, an RF output configured to operably couple to the plasma chamber, a first electronically variable capacitor having a first variable capacitance, and a second electronically variable capacitor having a second variable capacitance;

determining a first variable capacitance value and a second variable capacitance value for, respectively, the first electronically variable capacitor and the second electronically variable capacitor, for creating an impedance match at the RF input of the impedance matching network; and altering at least one of the first variable capacitance and the second variable capacitance to the first capacitance value and the second capacitance value, respectively, wherein an elapsed time between determining the variable impedance of the plasma chamber to when RF power reflected back to the RF source decreases is less than about 150 µsec.

10. The method of claim 9 wherein the steps of determining the first variable capacitance value and the second variable capacitance value and altering the at least one of the first variable capacitance and the second variable capacitance are repeated to create the impedance match.

11. The method of claim 10 wherein the impedance match is created in an elapsed time of about 500 µsec or less.

12. The method of claim 9 wherein the altering of the at least one of the first variable capacitance and the second variable capacitance comprises sending a control signal to at least one of a first driver circuit and a second driver circuit to control the first variable capacitance and the second variable capacitance, respectively, the first driver circuit operably coupled to the first electronically variable capacitor, and the second driver circuit operably coupled to the second electronically variable capacitor.

13. The method of claim 9 wherein the first electronically variable capacitor is operably coupled in series between the RF input and the RF output.

14. The method of claim 13 wherein the first electronically variable capacitor and the second electronically variable capacitor are positioned such that the impedance matching network is a T type matching network, the second electronically variable capacitor being operably coupled in series between the RF input and the RF output.

15. The method of claim 9 wherein the second electronically variable capacitor is operably coupled in parallel between a ground and one of the RF input and the RF output.

16. The method of claim 15 wherein the first electronically variable capacitor and the second electronically variable capacitor are positioned such that the impedance matching network is a pi (Π) type matching network, the first electronically variable capacitor being operably coupled between a ground and one of the RF input and the RF output.

17. The method of claim 9 wherein each of the first electronically variable capacitor and the second electronically variable capacitor comprises a plurality of discrete capacitors, each discrete capacitor having a corresponding switch to activate or deactivate the discrete capacitor;

wherein the first variable capacitance is altered to the first capacitance value by activating or deactivating at least one of the discrete capacitors of the first electronically variable capacitor; and wherein the second variable capacitance is altered to the second capacitance value by activating or deactivating at least one of the discrete capacitors of the second electronically variable capacitor.

18. The method of claim 9 wherein the determination of the first capacitance value for the first variable capacitance and the second capacitance value for the second variable capacitance is based on the determined variable impedance of the plasma chamber.

19. A method of manufacturing a semiconductor comprising:

placing a substrate in a plasma chamber configured to deposit a material layer onto the substrate or etch a material layer from the substrate; and energizing plasma within the plasma chamber by coupling RF power from an RF source into the plasma chamber to perform a deposition or etching, and while energizing the plasma:

determining, by an impedance matching network, a variable impedance of the plasma chamber, the impedance matching network comprising an RF input configured to operably couple to the RF source, an RF output configured to operably couple to the plasma chamber, a first electronically variable capacitor having a first variable capacitance, and a second electronically variable capacitor having a second variable capacitance;

determining a first variable capacitance value and a second variable capacitance value for, respectively, the first electronically variable capacitor and the second electronically variable capacitor, for creating an impedance match at the RF input of the impedance matching network; and altering at least one of the first variable capacitance and the second variable capacitance to the first capacitance value and the second capacitance value, respectively, wherein an elapsed time between determining the variable impedance of the plasma chamber to when RF power reflected back to the RF source decreases is less than about 150 μsec.

20. The method of claim 19 wherein each of the first and second electronically variable capacitors comprise a plurality of discrete capacitors; and wherein the alteration of at least one of the first variable capacitance and the second variable capacitance to the first capacitance value and the second capacitance value, respectively, is controlled by:

directing a first voltage into a first power switch;
directing a second voltage into a second power switch;
directing a common input signal into the first power switch and into the second power switch; and
controlling the first power switch and the second power switch with the common input signal, wherein the first power switch provides the first voltage to a common output in response to the common input signal, and the second power switch asynchronously provides, with respect to the first voltage, the second voltage to the common output in response to the common input signal, and wherein an electronic switch, which is operably coupled to the common output, is switched to activate or deactivate one of the discrete capacitors of one of the first electronically variable capacitor and the second electronically variable capacitor according to the first voltage or the second voltage being provided to the common output.

21. The method of claim 20 wherein the second voltage is opposite in polarity to the first voltage.

22. The method of claim 19 wherein the impedance match is created in an elapsed time of about 500 μsec or less and results in about 10% or less RF power reflected back to the RF source.

23. The method of claim 19 wherein the first electronically variable capacitor and the second electronically variable capacitor are positioned such that the impedance matching network is a pi (Π) type matching network, the first electronically variable capacitor being operably coupled between a ground and one of the RF input and the RF output, and the second electronically variable capacitor being operably coupled in parallel between a ground and one of the RF input and the RF output.

24. The method of claim 19 wherein each of the first electronically variable capacitor and the second electronically variable capacitor comprises a plurality of discrete capacitors, each discrete capacitor having a corresponding switch to activate or deactivate the discrete capacitor;

wherein the first variable capacitance is altered to the first capacitance value by activating or deactivating at least one of the discrete capacitors of the first electronically variable capacitor; and wherein the second variable capacitance is altered to the second capacitance value by activating or deactivating at least one of the discrete capacitors of the second electronically variable capacitor.

25. The method of claim 19 wherein the determination of the first capacitance value for the first variable capacitance and the second capacitance value for the second variable capacitance is based on the determined variable impedance of the plasma chamber.

* * * * *